United States Patent [19]

Kinoshita et al.

[11] Patent Number: 5,439,878
[45] Date of Patent: Aug. 8, 1995

[54] METHOD FOR PREPARING COPPER OXIDE SUPERCONDUCTOR CONTAINING CARBONATE RADICALS

[75] Inventors: Kyoichi Kinoshita, Hoya; Tomoaki Yamada, Higashimurayama, both of Japan

[73] Assignee: Nippon Telegraph and Telephone Corporation, Tokyo, Japan

[21] Appl. No.: 271,655

[22] Filed: Jul. 7, 1994

Related U.S. Application Data

[62] Division of Ser. No. 35,158, Mar. 22, 1993, Pat. No. 5,354,733.

[30] Foreign Application Priority Data

Mar. 23, 1992 [JP] Japan ..................... 4-64759
Mar. 24, 1992 [JP] Japan ..................... 4-65766

[51] Int. Cl.$^6$ ........................ H01B 1/06; H01B 1/08
[52] U.S. Cl. ........................ 505/491; 505/490; 505/300; 505/125; 505/785; 505/810; 505/815; 252/518; 252/521; 423/593; 423/635
[58] Field of Search .............. 505/300, 490, 491, 125, 505/785, 810, 815; 252/521, 518; 427/62; 423/593, 635

[56] References Cited

PUBLICATIONS

Izumi et al, "The crystal structure of the superconducting copper oxide carbonate $(Ba_{1-x}Sr_x)_2 Cu_{1+y}O_{2+2y+z}(CO_3)_{1-y}$", Physica C 196 (1992) pp. 227–235.

K. Osamura et al, "Crystal Structure of Ternary $Ba_8YCu_4O_{16}$-d Phase", Japanese Journal of Applied Physics, vol. 26, No. 12, Dec. 1987, pp. L2094–L2096.

T. G. Narendra Babu et al, "Synthesis, Structure and Electrical Properties of $Sr_2CuO_2(CO_3)$, an Oxide Carbonate related to Perovskite", J. Mater. Chem., 1991, (14), pp. 677–679.

Hirai et al., Nikkei Chyodendo, Feb. 3, 1992, pp. 6–7.

Chaillout et al, "Synthesis and crystal structure of $BaSrCuO_{2+x}CO_3$" Physica C 195 pp. 335–344.

Armstrong et al, "Synthesis and structure of $Sr_{1.5}Ba_{0.5}CuO_2(CO_3)$: An oxycarbonate containing infinite $CuO_2$ layers", Journal of Solid State Chemistry 98(2), Jun. 1992 pp. 432–436.

Kinoshita et al, "A new copper oxide superconductor containing carbon", Nature, vol. 357, May 1992, pp. 313–315.

Primary Examiner—Roy V. King
Attorney, Agent, or Firm—Spencer, Frank & Schneider

[57] ABSTRACT

A process for preparing a copper oxide superconductor of (Ba,Sr)-Cu-C-O containing carbonate radicals is disclosed, which comprises the steps of: mixing alkaline earth metal compounds and a copper compound with a molar ratio of 1.1 to 2.25 to obtain a mixture; pressing said mixture to form a pellet; and sintering said pellet in an oxygen atmosphere, wherein the alkaline earth metal compounds including a barium compound selected from the group consisting of barium carbonate and barium oxalate, and a strontium compound selected from the group consisting of strontium carbonate and strontium oxalate and the copper compound selected from the group consisting of copper carbonate, copper nitrate, copper oxalate and copper oxide.

6 Claims, 21 Drawing Sheets

METHOD FOR PREPARING COPPER OXIDE SUPERCONDUCTOR CONTAINING CARBONATE RADICALS

This is a division of application Ser. No. 08/035,158 filed Mar. 22, 1993, now U.S. Pat. No. 5,334,733.

BACKGROUND OF THE INVENTION

FIELD OF THE INVENTION

The present invention relates to oxide superconducting materials and methods for their preparation. It especially relates to a novel copper oxide superconducting material containing carbonate radicals and preparation methods thereof without using an apparatus for storing and supplying $CO_2$ gas. Furthermore, this invention relates to Josephson junctions using the novel superconducting material.

Description of the Prior Art

Several types of copper oxide superconductors have been discovered since high-Tc superconductivity was detected in the La-Ba-Cu-O system. Superconductivity would arise from the layered perovskite-like structure having $CuO_6$ octahedra, or $CuO_5$ pyramids, or $CuO_2$ square planes as a building unit. The layered perovskite-like structure and a sufficient carrier concentration of the material are essential factors for making the material superconducting as indicated by Osamura & Zhang (Japan. *J.Appl.Phys.* 26, L2094-L2096, 1987). In this reference, a series of samples with nominal composition $Ba_8YCu_4O_{16-d}$ did not show any superconducting properties. It is considered that these samples have not sufficient hole concentrations to generate such properties.

On the other hand, a compound $Sr_2CuO_2CO_3$ having $CO_3$ anions is known to contain layers of $CuO_6$ octahedra (Hirai et al., Nikkei Chyodendo 6-7, Feb. 3, 1992), but this compound was not made superconducting. The presence of carbonate as an impurity is known to degrade superconducting properties. Therefore, in the preparation of copper oxide superconductors much effort has been given to eliminate the carbonate impurity, and thus nobody is convinced of a superconducting material in which carbonate radicals are incorporated in the structure.

SUMMARY OF THE INVENTION

An object of the present invention is to provide a novel oxide superconductor containing carbonate radicals as a component.

Another object of the present invention is to provide a novel oxide superconductor with a large coherence length.

A further object of the present invention is to provide a method for preparing the aforementioned oxide superconductor.

A yet further object of the present invention is to provide a Josephson junction using an oxide superconductor containing carbonate radicals.

In the first aspect of the present invention, a copper oxide superconductor containing carbonate radicals, comprises:

a compound having a composition represented by the general formula $$(Ba_{1-x}Sr_x)_2Cu_{1+y}C_wO_{3+z}$$

wherein x, y, w and z satisfy the following relations:
$0.25 \leq x \leq 0.64$,
$-0.11 \leq y \leq 0.77$,
$0.89 \leq w \leq 1.77$, and
$1.67 \leq z \leq 4.33$.

In the second aspect of the present invention, a Josephson junction comprises:

two layers each having a composition represented by a general formula $(Ba_{1-x}Sr_x)_2Cu_{1+y}C_wO_{3+z}$ wherein x, y, w and z satisfy the following relations:
$0.25 \leq x \leq 0.64$,
$-0.11 \leq y \leq 0.77$,
$0.89 \leq w \leq 1.77$,
$1.67 \leq z \leq 4.33$, and an insulating layer is arranged between the two layers.

Here, the insulating layer may have a thickness of 5 Å to 10 Å.

The insulating layer may comprise a compound selected from the group consisting of $BaCO_3$, $SrCO_3$, $SrCuO_2$ and $Sr_2CuO_3$.

The insulating layer may comprise a compound having a composition represented by the general formula $(Ba_{1-x}Sr_x)_2CuO_2CO_3$, wherein x satisfies the relation $0 \leq x \leq 1$.

In the third aspect of the present invention, a process for preparing a copper oxide superconductor containing carbonate radical, comprises the steps of:

weighing and mixing alkaline earth metal compounds, and a copper compound or metallic copper so that the molar ratio of the alkaline earth metal to the metallic copper is in the range from 1.1 to 2.25 to thereby obtain a mixture, the alkaline earth metal compounds including a barium compound selected from the group consisting of barium carbonate and a barium oxalate, and a strontium compound selected from the group consisting of strontium carbonate and strontium oxalate, and the copper compound selected from the group consisting of copper carbonate, copper nitrate, copper oxalate and copper oxide, and copper metal; pressing the mixture to form a pellet; and sintering the pellet in an oxygen atmosphere.

The sintering step may be performed at a temperature within a range from 900° C. to 1050° C. in an atmosphere including oxygen partial pressure between 5 and 400 atm for a period from 10 to 100 hours.

The oxygen partial pressure may be in the range from 10 to 400 atm and the sintering step is performed in a mixed gas of oxygen and an inert gas by using a hot isostatic pressing apparatus.

The mixed gas may comprise argon gas and oxygen gas at a mixed ratio of 80:20.

The process for preparing may further comprise a calcining step calcinating the pellet before the sintering step, wherein the sintering step is performed at a temperature which is higher than the calcining step.

The calcining step may be performed at a temperature within a range from 800 to 870° C. for a period from 1 to 200 hours.

This method makes it possible to prepare novel superconductors having excellent superconducting properties.

The above and other objects, effects, features and advantages of the present invention will become more apparent from the following description of embodiments thereof taken in conjunction with the accompanying drawings.

DETAILED DESCRIPTION OF THE PREFERRED EMBODIMENTS

An oxide superconductor according to the present invention will be explained with reference to specific embodiments, however, it is to be understood that the invention is not intended to be limited to the specific embodiments described.

(A) Copper Oxide Superconductors Containing Carbonate Radicals and Having a Hole Concentration Sufficient to Produce Superconductivity In accordance with the present invention, a novel copper oxide superconductor containing carbonate radicals has a composition of the general formula: $(Ba_{1-x}Sr_x)_2Cu_{1+Y}C_WO_{3+z}$, wherein $0.25 \leq X \leq 0.64$, $-0.11 \leq Y \leq 0.77$, $0.89 \leq W \leq 1.77$ and $1.67 \leq Z \leq 4.33$. This composition is characterized by substituting all trivalent Y ions with divalent Sr ions in $Ba_8YCu_4O_{16-d}$, substituting some Ba ions with Sr ions to reduce the structural unstability generated by the difference between an ionic radius of Y and an ionic radius of Sr, and comprising carbon atoms of almost the same content as Cu to further increase the structural stability.

EXAMPLE 1

Starting materials of $BaCO_3$, $SrCO_3$ and CuO powders were weighed and mixed with each other to prepare a powder mixture thereof with a molar ratio of $BaCO_3:SrCO_3:CuO = 6:3:5$. The powder mixture was pressed into a pellet at about 1 t/cm² and sintered at a temperature of 980° C. for 50 hours in an oxygen atmosphere (8 atm) under an oxygen flow at a rate of 5,000 SCCM (standard state cc/min.). The composition of the resultant product was determined to be $(Ba_{0.75}Sr_{0.25})_8SrCu_5C_4O_{22}$ or $(Ba_{0.67}Sr_{0.33})_2Cu_{1.11}C_{0.89}O_{4.89}$, in which carbonate radicals of the starting materials were incorporated at a level of the mole fraction thereof which was nearly the same as that of Cu.

Figure 1:
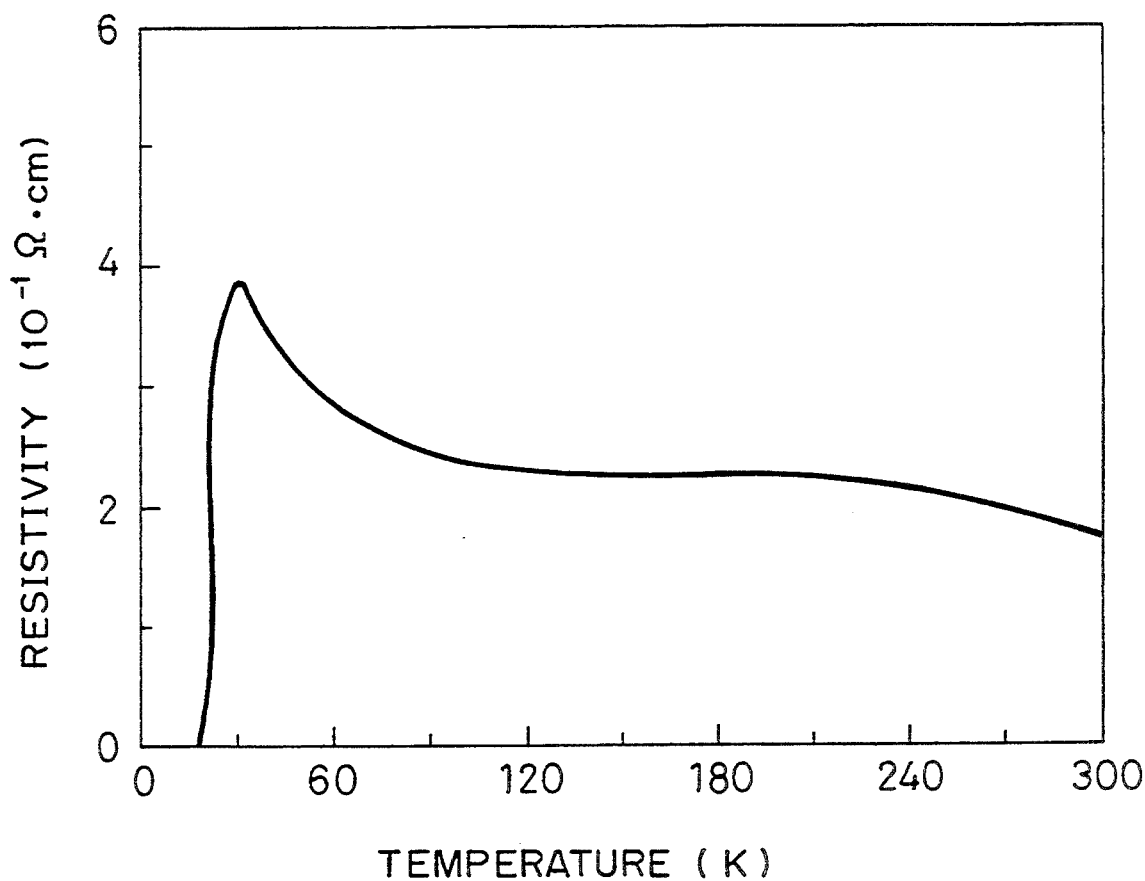
FIG. 1 is a diagram showing the temperature dependence of electrical resistivity for a sintered sample obtained by example 1.

FIG. 1 shows the temperature dependence of electrical resistivity for the sintered material as an example. In this figure, the sample was determined as a superconducting material having critical temperatures: $T_c$(on) = 30 K and $T_c$(zero) = 19 K.

Figure 2:
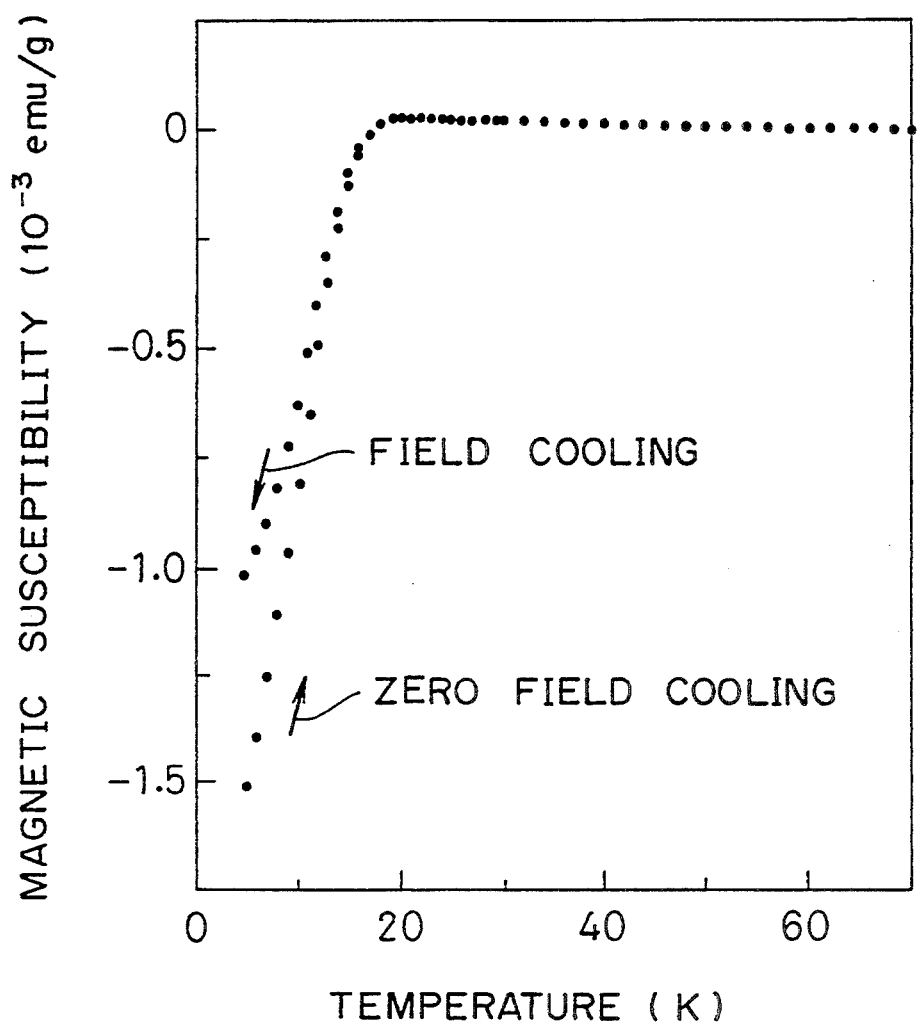
FIG. 2 is a diagram showing the temperature dependence of magnetic susceptibility for the sintered sample obtained by example 1 in zero field cooling or in field cooling.

The temperature dependence of magnetic susceptibility of the sample was measured with a superconducting quantum interference device (SQUID) magnetometer in zero field or in ten gausses under field-cooling conditions and the results were plotted in FIG. 2. As shown in the figure, the sample is a superconducting material because negative values of the magnetic susceptibility were observed at temperatures below 18 K in the field-cooling conditions. A level of Meissner volume fraction of the sample was more than 10% of that of an ideal diamagnet at a temperature of 5 K. Thus, the bulk nature of this sintered material's superconductivity was confirmed by these properties.

EXAMPLE 2

Starting materials of $BaCO_3$, $SrCO_3$ and CuO powders were weighed and mixed with each other to prepare a powder mixture thereof with a molar ratio of $BaCO_3:SrCO_3:CuO=6.8:2.2:4$. The powder mixture was pressed into a pellet at about 1 t/cm² and sintered at a temperature of 980° C. for 50 hours in an oxygen atmosphere (7 atm) under an oxygen flow at a rate of 5,000 SCCM.

The resultant sintered material was evaluated by the same measurement as that of example 1 and was confirmed as a superconducting material of $(Ba_{0.85}Sr_{0.15})_8SrCu_4C_4O_{21}$ or $(Ba_{0.75}Sr_{0.25})_2Cu_{0.89}C_{0.89}O_{4.67}$ with the critical temperatures of $T_c(on)=14$ K and $T_c(zero)=5$ K.

Figure 3:
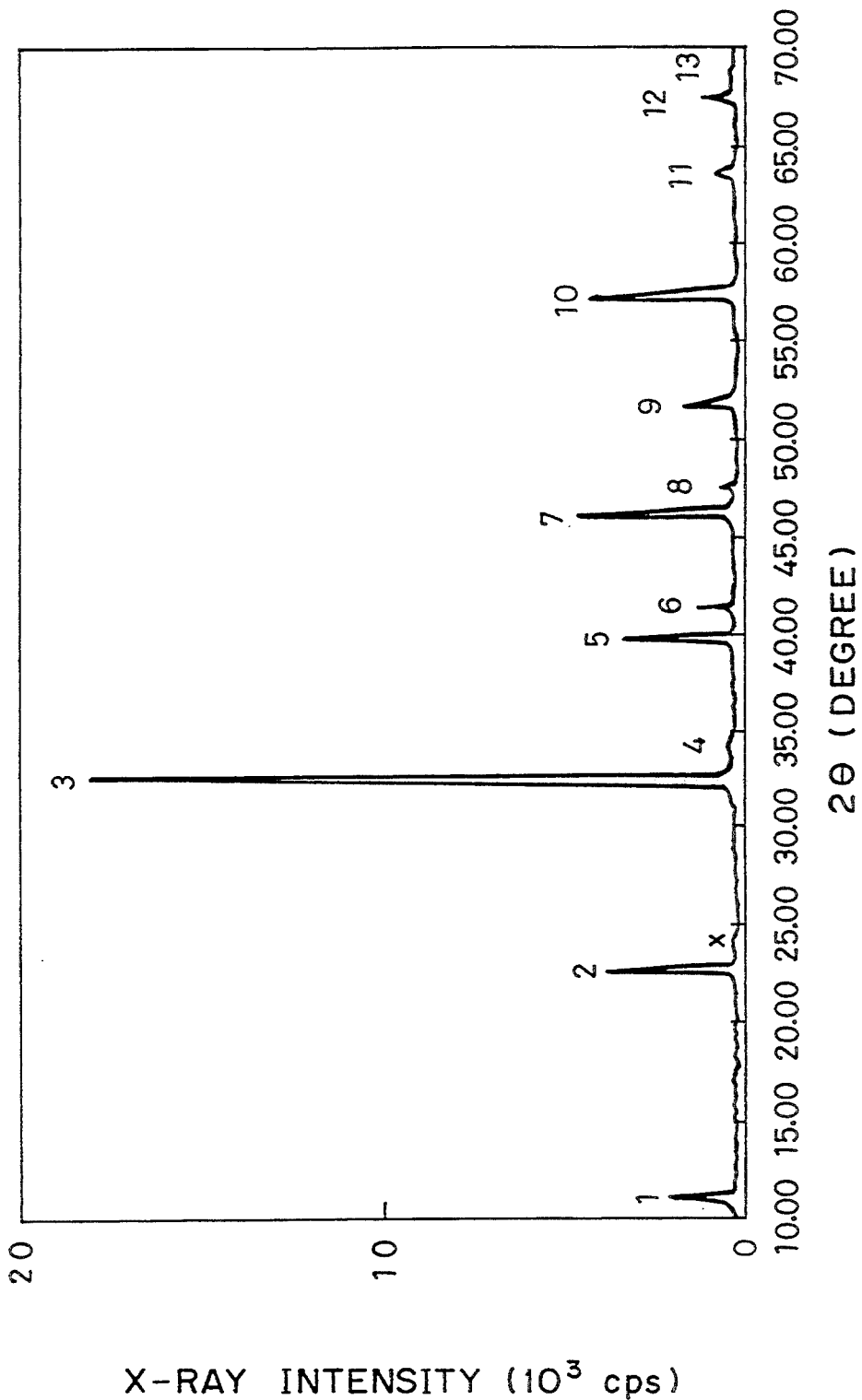
FIG. 3 is an X-ray powder diffraction pattern of a sintered sample obtained by example 2.

FIG. 3 shows the X-ray diffraction pattern of this sample obtained with Cu Kα radiation. It was suggested from the diffraction pattern that the crystal has substantially a single phase with small impurity peak shown by the mark X. In this figure, the peaks of the diffraction pattern are marked with numerals. The relation between the peak numbers and the lattice spacings (d values) is listed in Table 1.

TABLE 1

| Peak No. | d value (Å) |
| --- | --- |
| 1 | 7.886 |
| 2 | 3.943 |
| 3 | 2.785 |
| 4 | 2.628 |
| 5 | 2.272 |
| 6 | 2.181 |
| 7 | 1.969 |
| 8 | 1.910 |
| 9 | 1.761 |
| 10 | 1.607 |
| 11 | 1.463 |
| 12 | 1.391 |
| 13 | 1.369 |

Furthermore, Hall measurement showed that the superconductor has P-type carriers (holes) at a level of $1.4\times10^{21} cm^{-3}$.

EXAMPLES 3–18

A series of samples with nominal composition $(Ba_xSr_x)_2Cu_{1+Y}C_WO_{3+Z}$ ($0.25<X<0.64$, $-0.11<Y<0.77$, $0.89<W<1.77$, $1.67<Z<4.33$) was synthesized from starting materials of $BaCO_3$, $SrCO_3$ and CuO powders as follows.

Before the sintering process, these starting materials were weighed and mixed with each other to prepare a powder mixture thereof.

In the sintering process, the powder mixture was pressed into a pellet at about 0.5–2.0 t/cm² and sintered at a temperature of 950°–1,000° C. for 20–50 hours in an oxygen atmosphere (8 atm) under an oxygen flow at a rate of 3,000–5,000 SCCM.

The resultant sintered materials were evaluated by the same measurement as that of the example 1 and were confirmed as superconducting materials having their transition temperatures $T_c(zero)$ depended on their compositions and sintering temperatures as listed in Table 2.

TABLE 2

| Exp. | Composition | sintering temp. (°C.) | $T_c$ (Zero) (K) |
| --- | --- | --- | --- |
| 3 | $(Ba_{0.85}Sr_{0.15})_8SrCu_7C_5O_{26}$ | 980 | 4 |
| 4 | $(Ba_{0.8}Sr_{0.2})_8SrCu_4C_4O_{21}$ | 980 | 9 |
| 5 | $(Ba_{0.8}Sr_{0.2})_8SrCu_{4.5}C_4O_{21.5}$ | 950 | 14 |
| 6 | $(Ba_{0.75}Sr_{0.25})_8SrCu_5C_4O_{22}$ | 980 | 16 |
| 7 | $(Ba_{0.75}Sr_{0.25})_8SrCu_6C_4O_{25}$ | 950 | 16 |
| 8 | $(Ba_{0.70}Sr_{0.30})_8SrCu_7C_5O_{26}$ | 980 | 18 |
| 9 | $(Ba_{0.70}Sr_{0.30})_8SrCu_8C_{5.5}O_{28}$ | 980 | 7 |
| 10 | $(Ba_{0.65}Sr_{0.35})_8SrCu_7C_5O_{26}$ | 980 | 16 |
| 11 | $(Ba_{0.65}Sr_{0.35})_8SrCu_{5.5}C_4O_{22.5}$ | 950 | 18 |
| 12 | $(Ba_{0.5}Sr_{0.5})_8SrCu_6C_5O_{25}$ | 980 | 8 |
| 13 | $(Ba_{0.4}Sr_{0.6})_8SrCu_6C_5O_{25}$ | 1,000 | 5 |
| 14 | $(Ba_{0.4}Sr_{0.6})_8SrCu_7C_5O_{26}$ | 1,000 | 6 |
| 15 | $(Ba_{0.75}Sr_{0.25})_8SrCu_5C_5O_{24}$ | 900 | 4 |
| 16 | $(Ba_{0.7}Sr_{0.3})_8SrCu_5C_4O_{22}$ | 1,000 | 23 |
| 17 | $(Ba_{0.65}Sr_{0.35})_8SrCu_5C_4O_{22}$ | 1,000 | 24 |
| 18 | $(Ba_{0.65}Sr_{0.35})_8SrCu_{5.5}C_4O_{22.5}$ | 1,000 | 31 |

From the results of examples 1–18, the hole concentration can be increased to a level sufficient enough to generate a superconducting state in the copper oxide superconductor containing carbon by substituting trivalent Y atoms with divalent Sr atoms of the conventional compound $Ba_8YCu_4O_{16-d}$.

In the examples 1–18, the sintering process was performed without a calcination step preceded the sintering. However, the calcination was performed in the following examples 19–21 to obtain superior superconducting materials. This is because synthesis under an oxygen partial pressure higher than 10 atm is needed to improve superconducting properties, and at such high oxygen pressures, gas flow in a furnace is impossible and carbonate content should be adjusted prior to the sintering.

B: Method for Preparing Copper Oxide Superconductors Containing Carbonate Radicals Including Calcination Step A superconducting material in accordance with the present invention is made of a copper oxide containing carbonate radicals and it can be prepared by the process comprising sintering steps in an oxygen atmosphere as in the case of other High-$T_c$ copper oxide ceramics. Calcination may be performed preceding the sintering step. The process for preparing the material with superior superconducting properties is required to satisfy a certain condition in which a temperature in the calcination step must be lower than that of the sintering process, and performing the sintering process in an oxygen atmosphere at higher pressure than that of the calcination.

A preferable method for preparing the superconducting material in accordance with the present invention comprises the steps of: (i) preparing a powder mixture of $BaCO_3$, $SrCO_3$ and CuO with a molar ratio of $(BaCO_3+SrCO_3):CuO$ in the range from 9:4 to 9:8 from $BaCO_3$, $SrCO_3$ and CuO powders; (ii) pressing the powder mixture into a pellet at a pressing pressure of about 1 t/cm²; (iii) calcining the pellet at a temperature of 800°–870° C. or preferably of 840°–860° C. for 1–200 hours or preferably for 10–100 hours to thermally decompose almost half the amount of the starting materials comprising carbonates, i.e., $BaCO_3$ and $SrCO_3$ into $BaO+CO_2$ and $SrO+CO_2$, respectively, and to incorporate the remaining carbonate radicals into the crystalline structure of the material; and (iv) sintering the calcined pellet to be formed as a composition $(Ba_{1-x}Sr_x$ $)_2Cu_{1+Y}C_WO_{3+Z}$ (0.25≦X≦0.64, −0.11'Y≦0.77, 0.89≦W≦1.77, 1.67≦X≦4.33).

Figure 4:
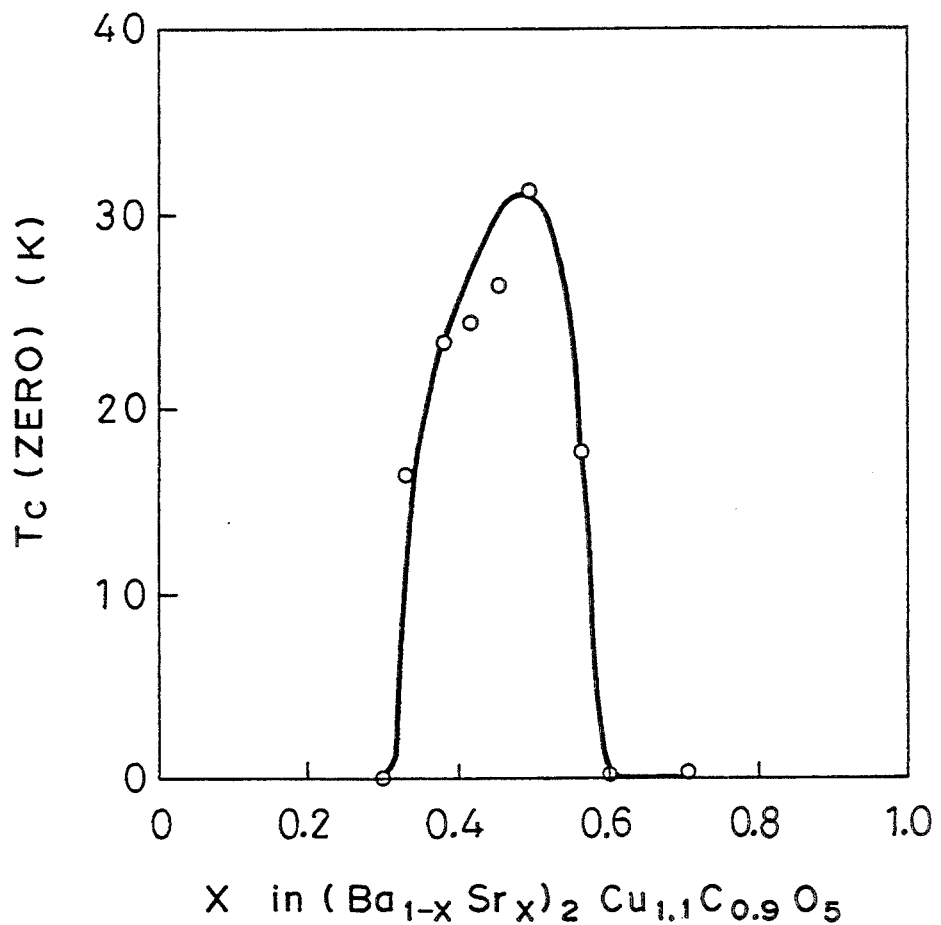
FIG. 4 is a diagram showing the relationship between zero resistance temperature (To(zero)) and the value x of a superconducting material defined by the formula $(Ba_{1-x}Sr_x)_2Cu_{1.1}C_{0.9}O_5$.
Figure 5:
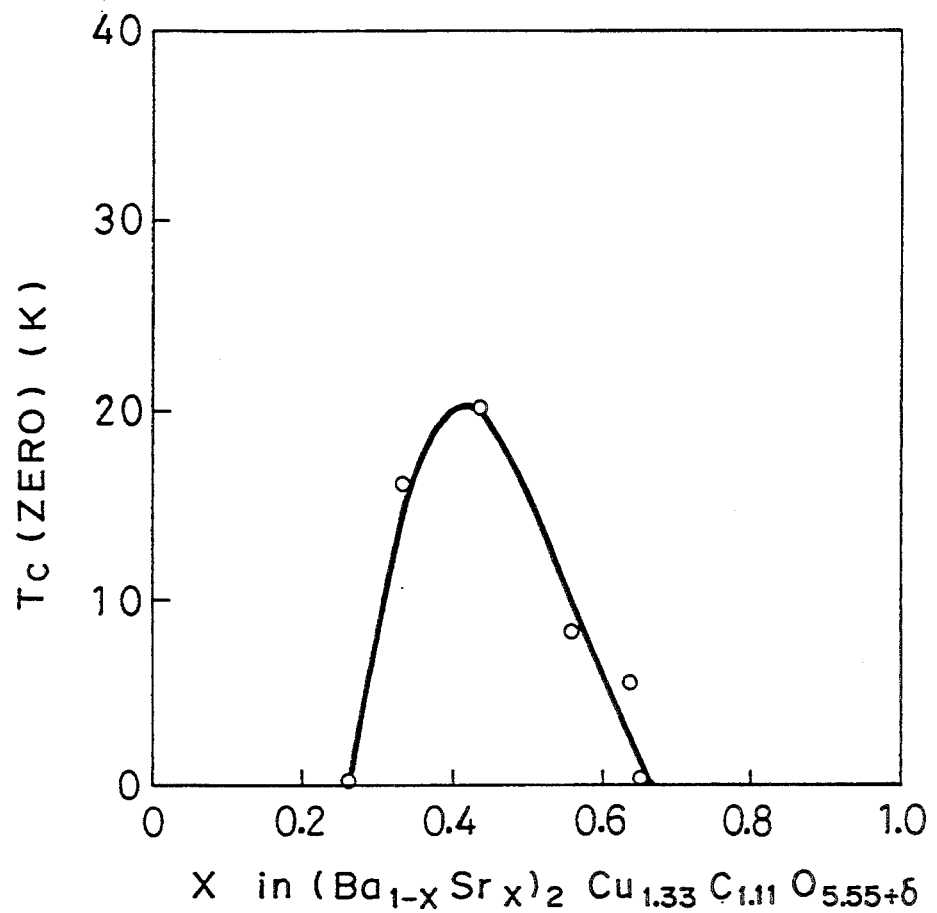
FIG. 5 is a diagram showing the relationship between zero resistance temperature (To(zero)) and the value x of a superconducting material defined by the formula $(Ba_{1-x}Sr_x)_2Cu_{1.33}C_{1.11}O_{5.55+\delta}$.
Figure 6:
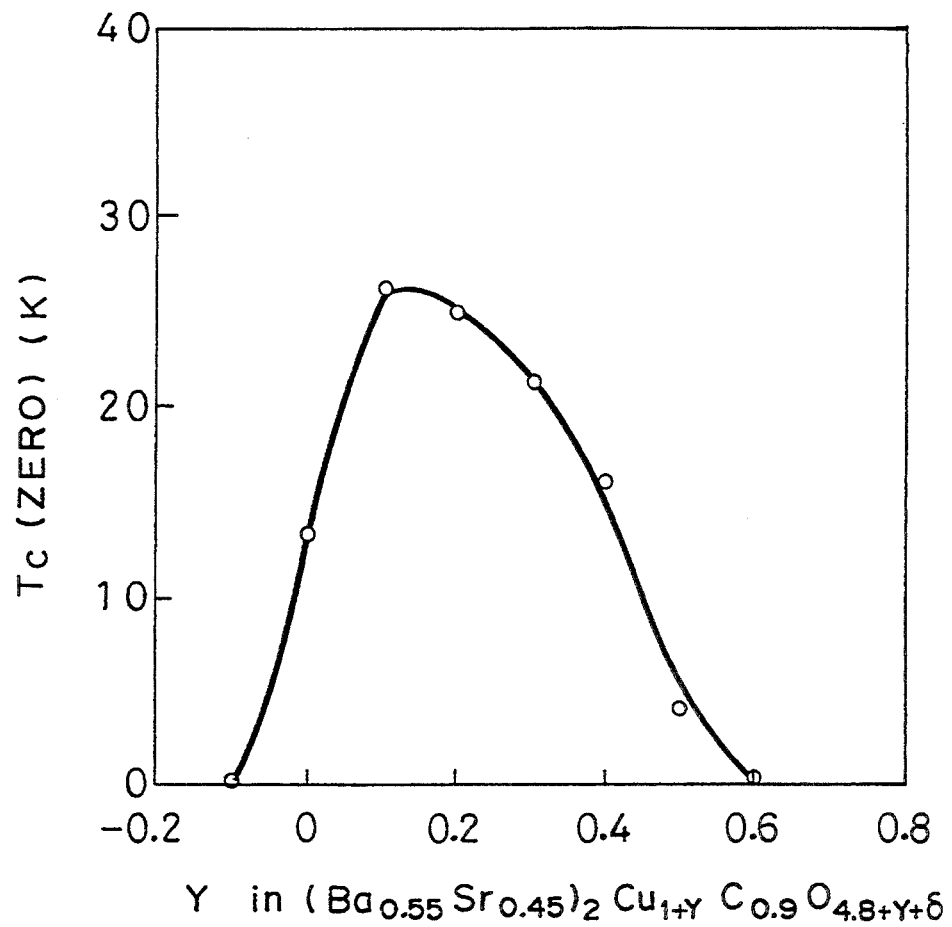
FIG. 6 is a diagram showing the relationship between zero resistance temperature (To(zero)) and the value Y of a superconducting material defined by the formula $(Ba_{0.55}Sr_{0.45})_2Cu_{1+Y}C_{0.9}O_{4.8+Y+\delta}$.
Figure 7:
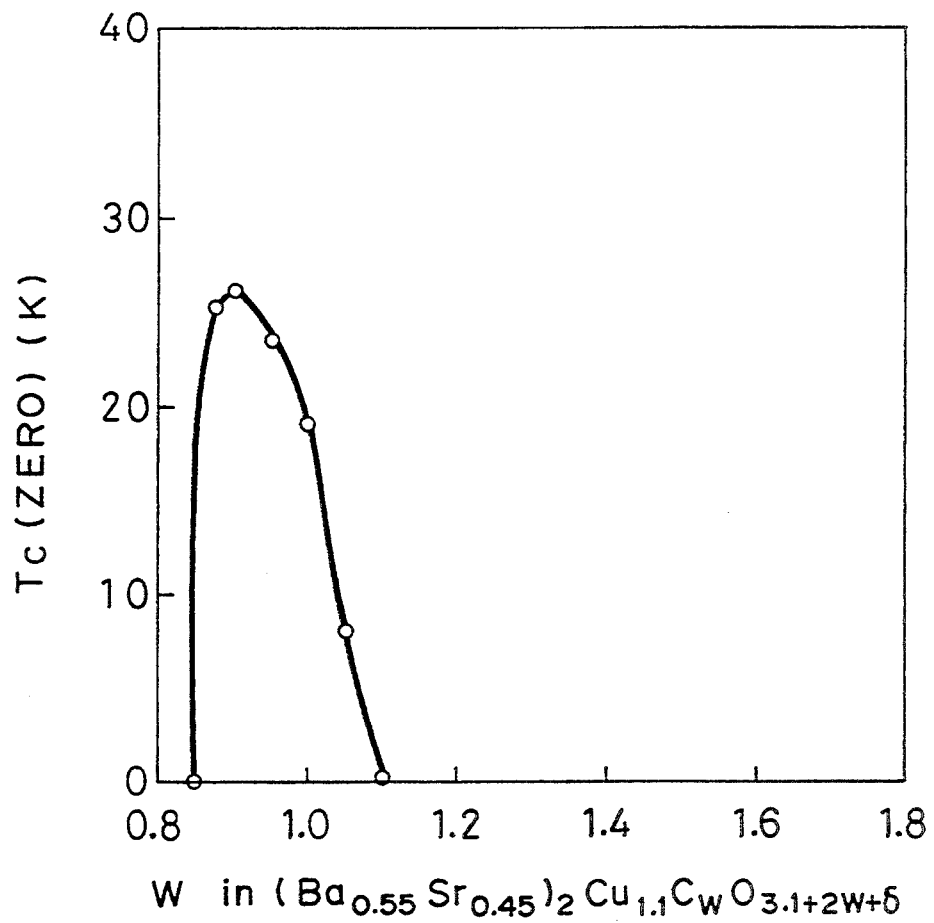
FIG. 7 is a diagram showing the relationship between zero resistance temperature ($T_c$(zero)) and value W of a superconducting material of $(Ba_{0.55}Sr_{0.45})_2Cu_{1.1}C_WO_{3.1+2W+\delta}$.

FIGS. 4–7 show relationships between each symbol X, Y, W or Z in the general formula $(Ba_{1-x}Sr_x)_2Cu_{1+Y}C_WO_{3+Z}$ and $T_c$(zero) values. It is clear from the results in these figures that the symbols X, Y, W and Z must be defined in the range of 0.25<X<0.64, −0.11<Y<0.77, 0.89≦W≦1.77, 1.67≦Z≦4.33, respectively, so as to provide the material with superconducting properties. In the case of Y=0.1 and W=0.9, for example, the compound having the general formula $(Ba_{1-x}Sr_x)_2Cu_{1.1}C_{0.9}O_{3+z}$ is obtained and it becomes a superconducting material when the value of X is in the range from 0.3 to 0.6 (FIG. 4). In the case of Y=0.3 and W=1.1, for another example, the compound having a general formula $(Ba_{1-x}Sr_x)_2Cu_{1+0.3}C_{1.1}O_{5.55+\delta}$ is obtained and it becomes a superconducting material when the value of X is defined in the range from 0.25 to 0.64 (FIG. 5). In the case of X=0.45 and W=0.9, for further example, the compound having a general formula $(Ba_{0.55}Sr_{0.45})_2Cu_{1+Y}C_{0.9}O_{4.8+Y+\delta}$ is obtained and it becomes a superconducting material when the value of Y is defined in the range from −0.11 to 0.6 (FIG. 6). In the case of X=0.45 and Y=0.1, for a further example, the compound having the general formula $(Ba_{0.55}Sr_{0.45})_2Cu_{1.1}C_WO_{3.1+2W+\delta}$ is obtained and it becomes a superconducting material when the value of W is defined in the range from 0.89 to 1.1 (FIG. 7). It is noted that the amount of oxygen indicated by the symbol Z can be dependent on not only the compositions of the raw materials but also the amount of C-site substitution by Cu atoms, and on a dissociation rate of oxygen atoms at the substitution and the like, and hence the relationship between $T_c$(zero) and the value of Z cannot be illustrated.

Figure 8:
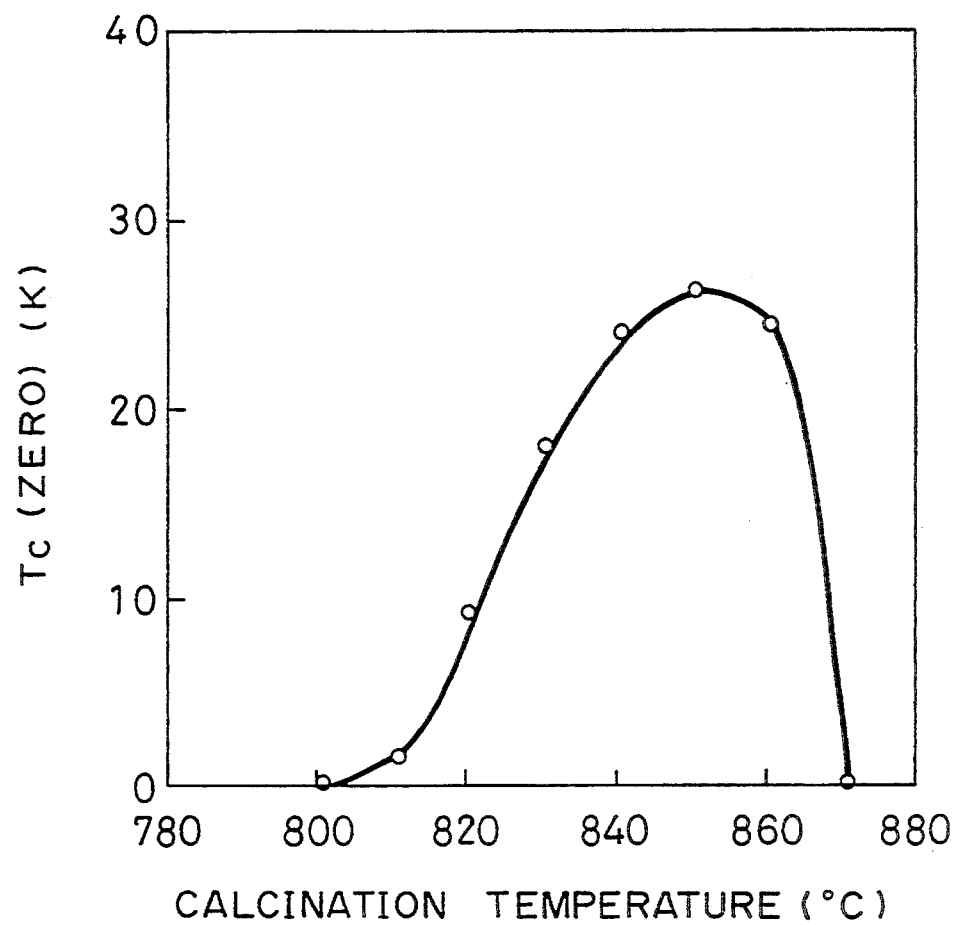
FIG. 8 is a diagram showing the relationship between the calcinating temperature of a mixture ($BaCO_3 + SrCO_3 + 1.1$ CuO) calcined for 50 hours in air and $T_c$(zero) values of samples obtained by sintering the calcined materials in $O_2$ at a partial pressure of 50 atm at 1000° C. for 50 hours without gas flow.

FIG. 8 shows the relationship between temperatures for calcining a pellet of a mixture ($1.1BaCO_3 + 0.9SrCO_3 + 1.1CuO$) for 50 hours and $T_c$(zero) values of a sample obtained by sintering the calcined pellet in an oxygen atmosphere (50 atm) at 1000° C. for 50 hours. As shown in this figure, the calcining temperature is a very important factor to provide the sample with superconducting properties, i.e., a sample calcined at a temperature lower than 800° C. cannot show any superconductivity despite the sample being treated with the sintering step after the calcination. As a result of the insufficient thermal decomposition of carbonates in the starting materials due to lower calcinating temperatures, the remaining carbonates can be detected in this sample. On the other hand, in a sample which is subjected to the calcination at temperatures higher than 870° C., the carbonate radicals cannot be incorporated into the crystalline structure of the material because carbonates are perfectly decomposed into an oxidized residues and carbon dioxide gas. Therefore, the calcination temperature should be defined in the range from 800 to 870° C. or preferably from 840 to 860° C. In this temperature range, the calcination period required for providing the material with superconducting properties is from 1 to 200 hours or preferably from 10 to 100 hours. If the calcination period is less than 1 hour, even when the calcination temperature is in the above range or higher, the calcined product cannot be uniform and thus it cannot be provided with excellent superconducting properties by the sintering step. The rate of thermal decomposition is dependent on the calcination temperature, so that the longer calcination period is required when the calcination is performed at lower temperatures. However, performing the calcination at the lower temperatures does not have any advantage, and also performing the calcination for longer period is not mass-productive for practical application.

The sintering process in accordance with the present invention is performed at 900°–1050° C. for about 50 hrs in an $O_2$ atmosphere ($O_2$ partial pressure of 5–400 atm).

Figure 9:
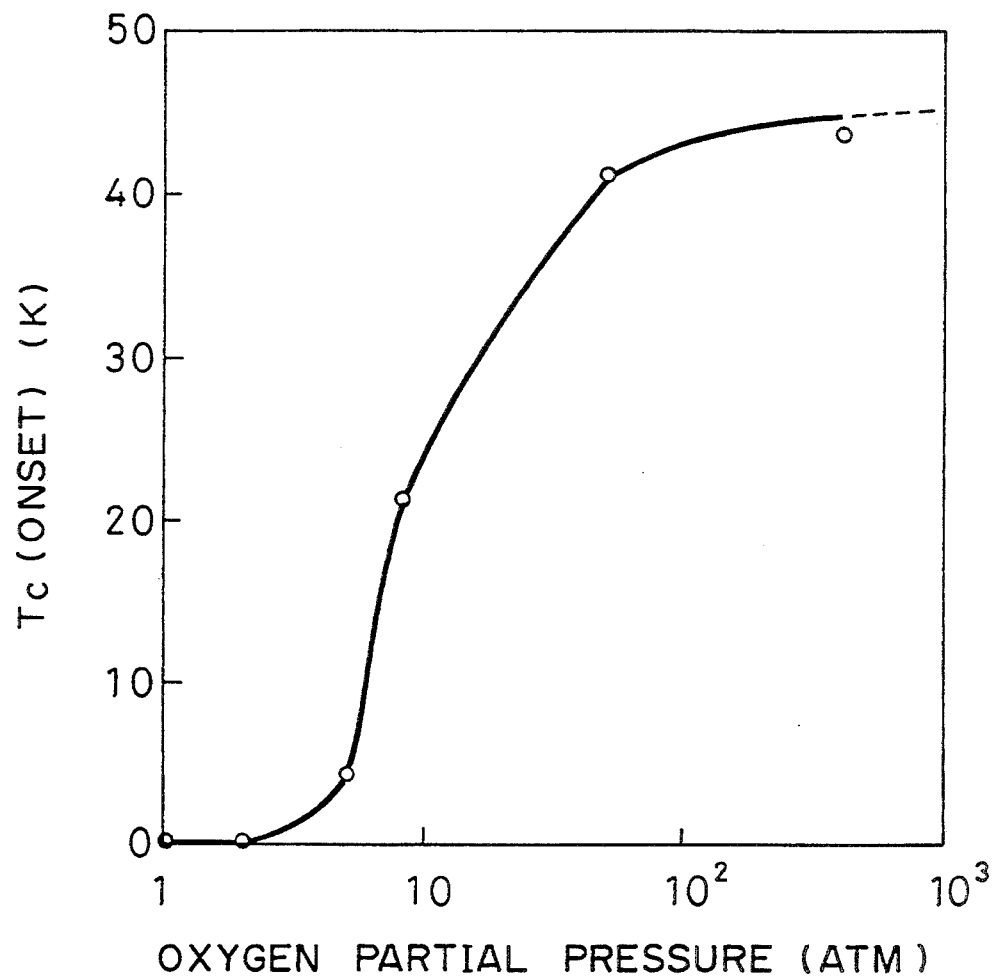
FIG. 9 is a diagram showing the relationship between the $O_2$ partial pressure during sintering of a material $(Ba_{0.55}Sr_{0.45})_2Cu_{1.1}O_{2.2+\delta}(CO_3)_{0.9}$ at 1000° C. for 50 hours without gas flow and the temperature (To(onset)) at which the resistivity begins to decrease suddenly.
Figure 10:
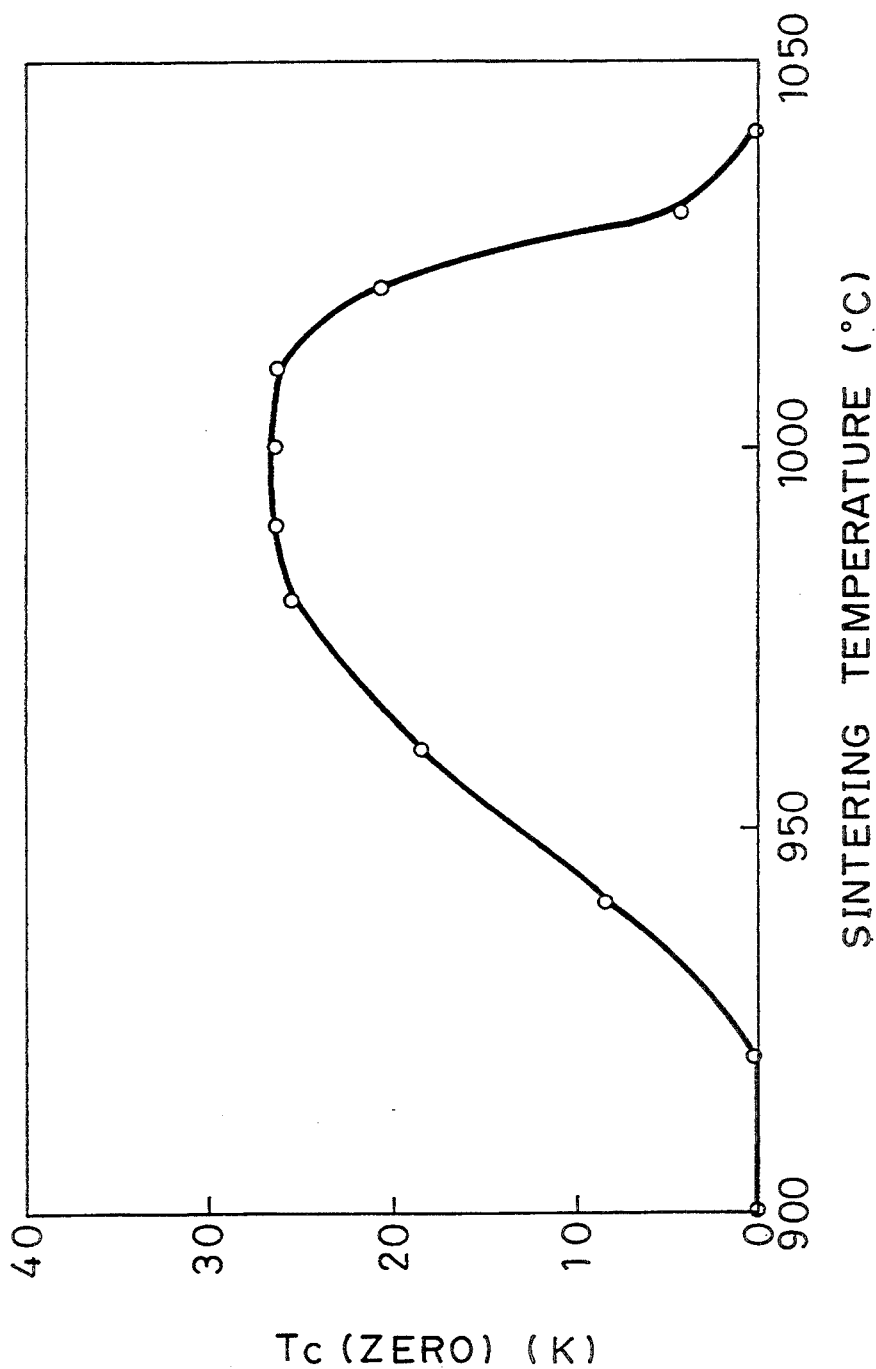
FIG. 10 is a diagram showing the relationship between sintering temperature and $T_c$(zero) of samples sintered in $O_2$ at a partial pressure of 50 atm for 50 hours after calcining a mixture ($BaCO_3 + SrCO_3 1.1$ CuO) at 850° C. in air for 50 hours.

FIG. 9 shows the relationship between the $O_2$ partial pressure during sintering and the onset temperature, $T_c$(onset), at which the resistivity being to decrease suddenly, and also FIG. 10 shows the relationship between the sintering temperature and the zero resistance temperature ($T_c$(zero)) of the sample.

Figure 11:
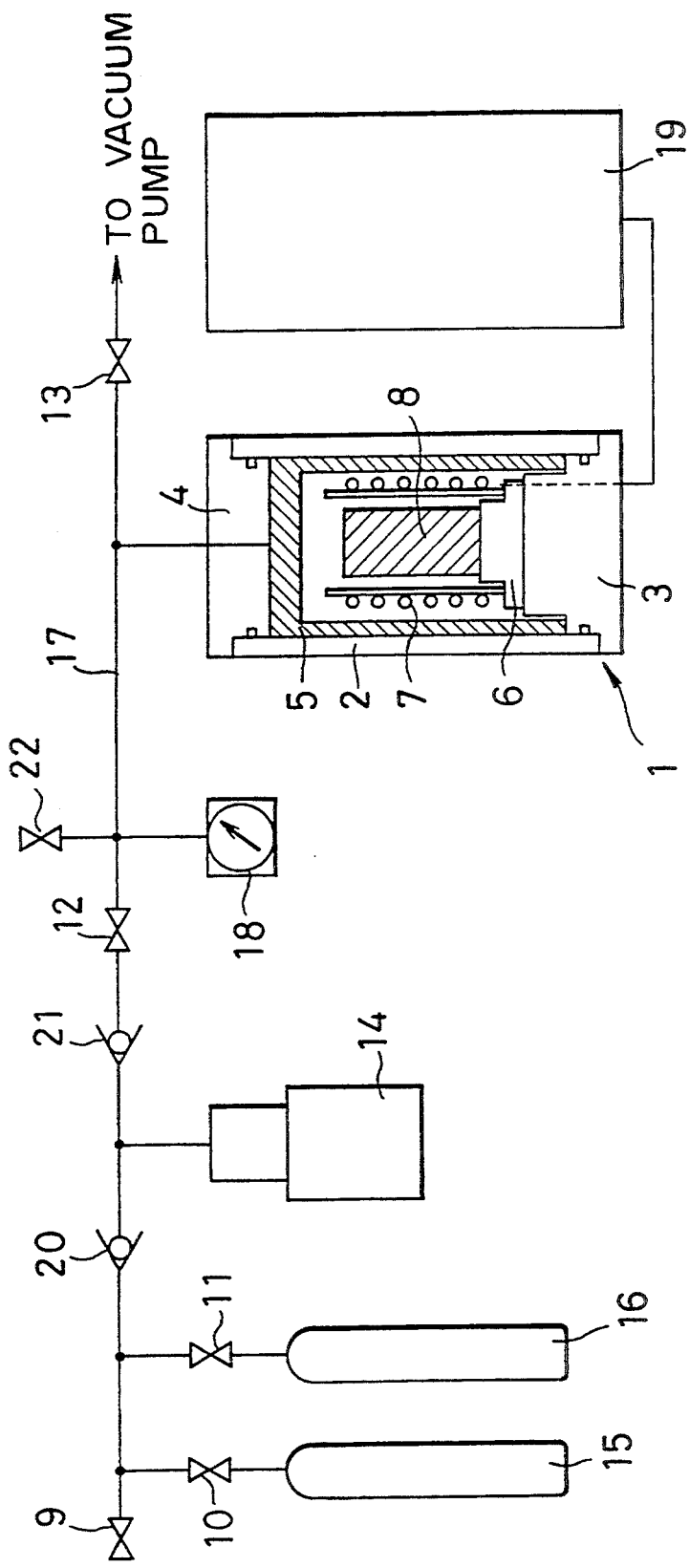
FIG. 11 is a schematic diagram illustrating a hot isostatic pressing furnace.
Figure 12:
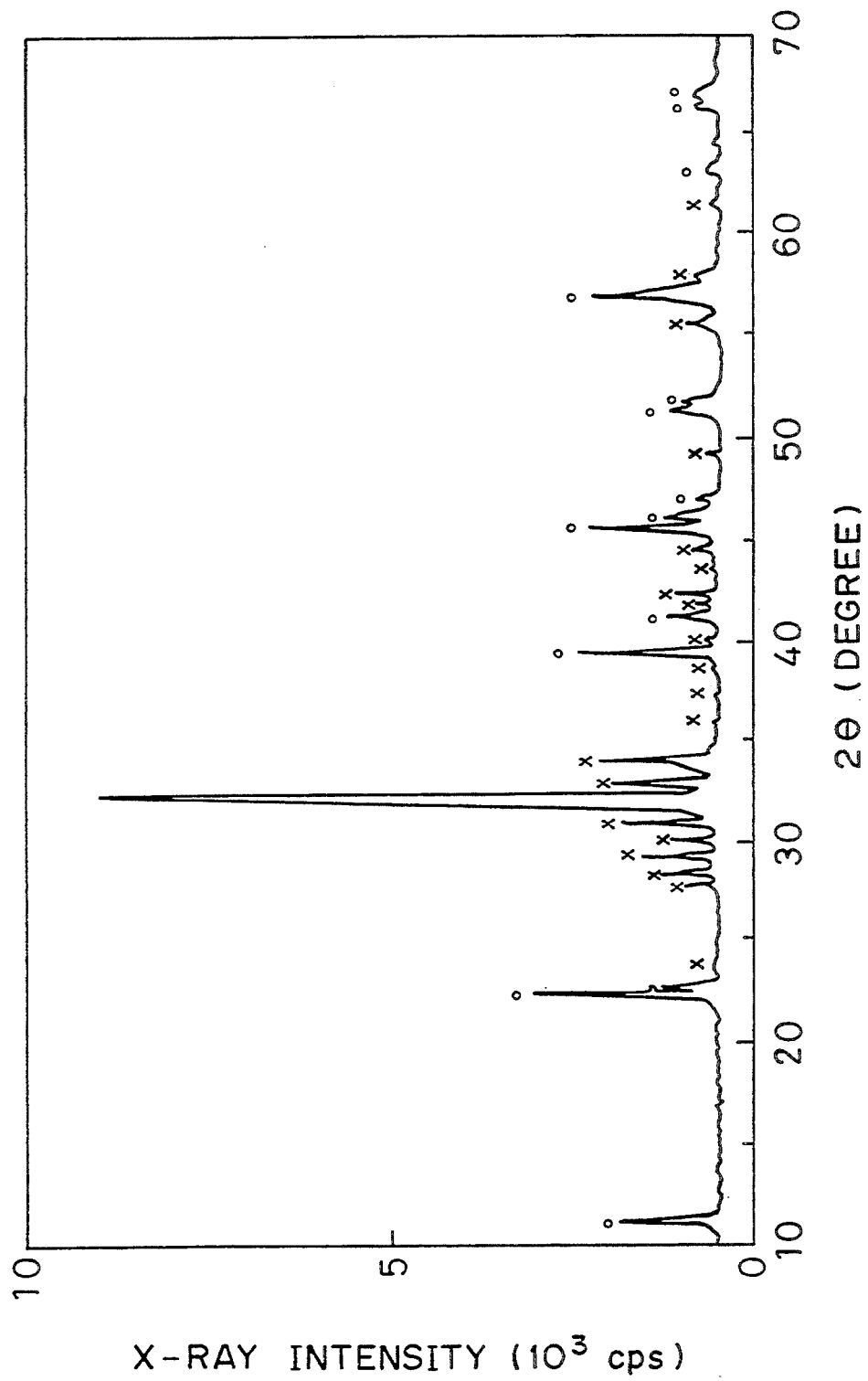
FIG. 12 is a diagram showing an X-ray powder diffraction pattern of a calcined sample obtained by example 19.

In a practical manufacturing process for the superconductor, the sintering step is performed in a pure oxygen atmosphere when $O_2$ partial pressure is less than 10 atm while it is performed in a mixture gas (80% Ar and 20% $O_2$) using a hot isostatic pressing (HIP) furnace when oxygen partial pressure is higher than 10 atm as shown in FIG. 11.

In this figure, a pressure vessel 1 is composed of a cylinder 2, a bottom closure 3, a top closure 4 and an insulation mantle 5. The pressure vessel 1 is provided with a support 6 for supporting a sample or samples 8 to be processed and a heating element 7 for heating the supported sample. The pressure vessel 1 is evacuated with a vacuum pump. Then by operating valves 10, 11, 12 and 13, and gas compressor 14, mixture gas is supplied into the pressure vessel 1 from a gas storage unit 15 or 16 through a pipe 17. The gas pressure in the pressure vessel 1 is regulated at a desired value with a pressure regulator 18. When the total pressure of the mixture gas reaches a desired value, gas supply to the pressure vessel stops. The heating element 7 is heated with a power supply and control unit 19. Reference numerals 20 and 21 are back flow check valves and 9 and 22 are safety valves.

EXAMPLE 19

Starting materials of $BaCO_3$, $SrCO_3$, and CuO powders were weighed and mixed with each other to prepare a powder mixture thereof with a molar ratio of $BaCO_3:SrCO_3:CuO = 5:4:5$ (molar ratio of the alkaline earth metals to copper being 1.8:1). The powder mixture was pressed into a pellet and calcined in air at 850° C. for 50 hours. The obtained calcined pellet was broken into powder by pressing, and then the powder was subjected to an X-ray diffraction pattern analysis using characteristics X-rays (CuKα) from a Cu target. As a result, it was observed that $(Ba_{1-z}Sr_z)_2CuO_2CO_3$, $BaCuO_2$ and $Sr_2CuO_3$ were formed. A trace of $BaCO_3$ was only observed. At this step, the formation of a small amount of $Sr_2CuO_3$ could not be prevented, when this amount is too much $Sr_2CuO_3$ remains as an impurity after the sintering. In order to suppress the formation of $Sr_2CuO_3$, it is preferable to calcine at a low temperature and for a long time. However, if the calcination temperature is too low, $BaCO_3$ is not decomposed and remains. This is because the dissociation pressure of $BaCO_3$ is lower than that of $SrCO_3$.

Figure 13:
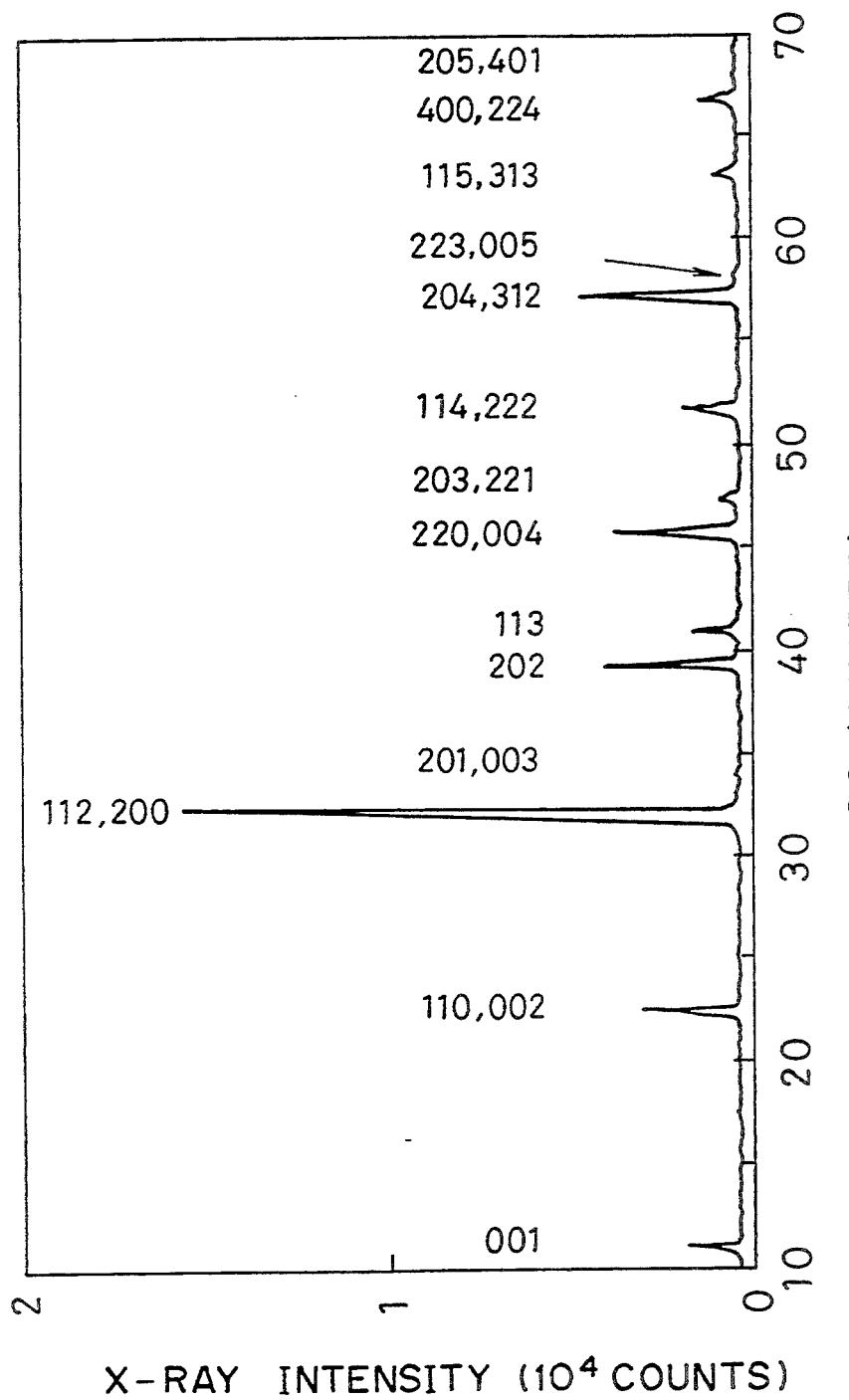
FIG. 13 is a diagram showing an X-ray powder diffraction pattern of a sintered sample obtained by example 19.

Next, the foregoing calcined pellet was disposed in the HIP furnace and sintered at 1,000° C., for 50 hours under a total pressure of 250 atm of a mixed gas of 20% oxygen and 80% argon (partial pressure of oxygen being 50 atm). FIG. 13 shows an X-ray powder diffraction pattern of the sintered material. As will be understood from this figure, impurity peaks of $BaCuO_2$ and $Sr_2CuO_3$, which existed after the calcination, disappeared and a sample with a single phase was obtained. Metallic elements of this compound were quantitatively analyzed by a plasma emission spectrochemical analysis method and carbon was quantitatively analyzed by a combustion analysis method, and the results showed that this compound contained carbonate radical ($CO_3$) and the composition thereof was $Ba_5Sr_4Cu_5O_{10+c}(CO_3)_4$ (wherein $d=0.5$). The crystal system of this compound was a tetragonal system and if assuming lattice constants of $a=5.56$ Å and $c=7.86$ Å, all peaks could be indexed as shown in FIG. 13.

Figure 14:
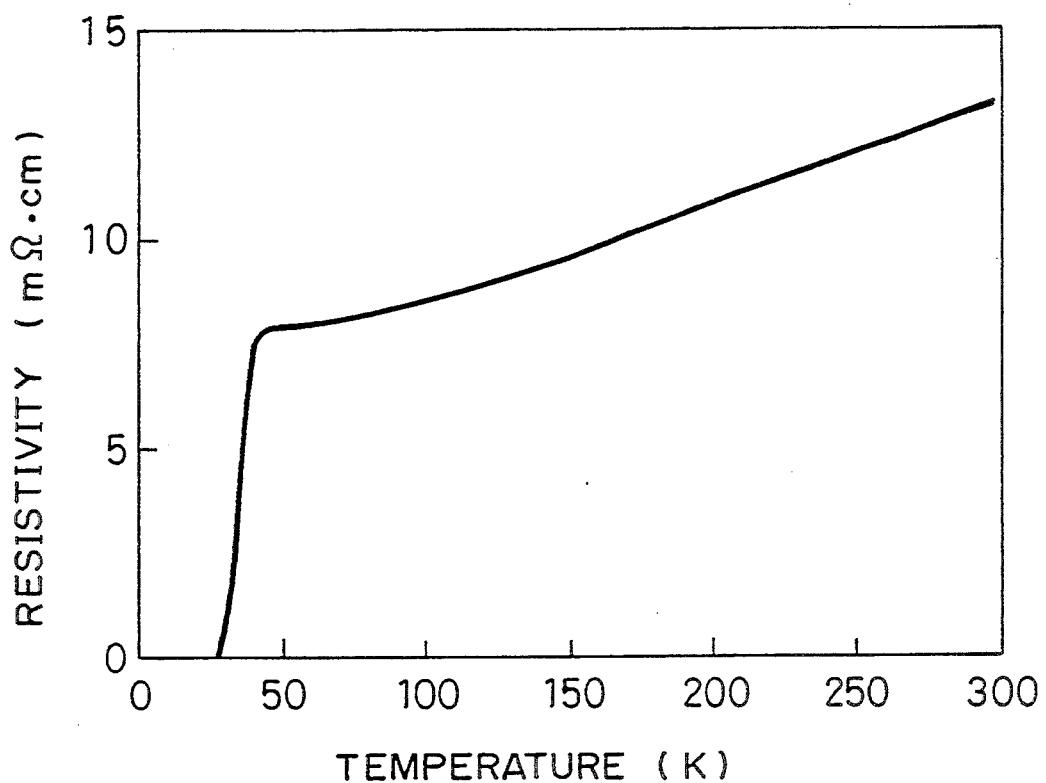
FIG. 14 is a diagram showing the temperature dependence of electrical resistivity for the sintered sample obtained by example 19.
Figure 15:
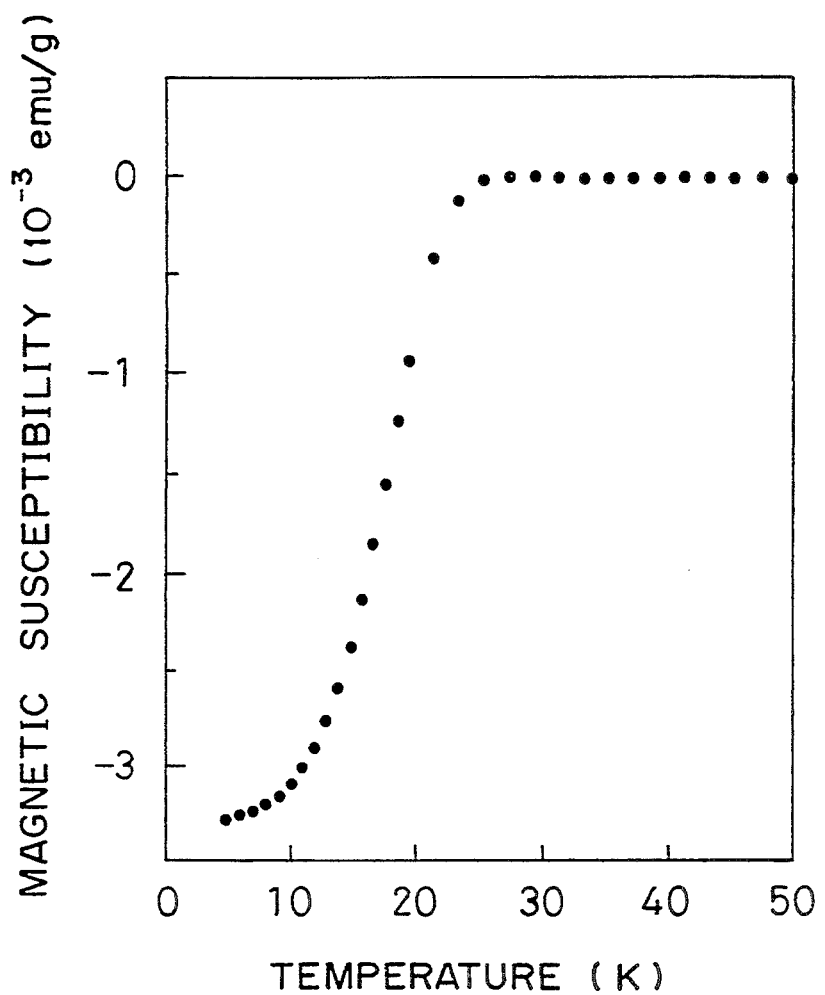
FIG. 15 is a diagram showing the temperature dependence of magnetic susceptibility for the sintered sample obtained by example 19.

Dependence of the resistivity of the aforementioned material on temperature is shown in FIG. 14. As will be understood from FIG. 14, the resistivity begins to decrease at about 40 K and is completely zero at 26 K. FIG. 14 shows the dependence of the magnetic susceptibility of this sintered material on temperature when it is cooled under a magnetic field of 10 gausses. As will be understood, since the magnetic susceptibility is negative at a temperature of 20 K or lower in the magnetic-field cooling condition, this compound is a superconductor. By comparison of the above characteristics with that of the ideal diamagnet, a level of the Meissner volume fraction of the sample is 20% or more at 5 K. And this shows that this compound is a bulk superconductor. Such a level of the Meissner volume fraction is higher than that of the superconductor ($\approx 10\%$) synthesized without calcination as shown in example 1, and showed a superior superconducting property.

EXAMPLE 20

Starting materials of $BaC_2O_4$, $SrC_2O_4$ and metallic Cu were weighed and mixed with each other to prepare a mixture with a molar ration of $BaC_2O_4:SrC_2O_4:Cu=1:1:1$ (molar ratio of alkaline earth metals: Cu being 2:1). The mixture was pressed into a pellet at about 1 t/cm$^2$ and calcined at a temperature of 800° C. for 20 hours in air. The composition of the resultant calcined material was determined to be a mixture of $Ba_{2-x}Sr_xSuO_2(CO_3)$(X is about 1.1), $BaCO_3$, $BaCuO_2$, and $Sr_2CuO_3$.

Figure 16:
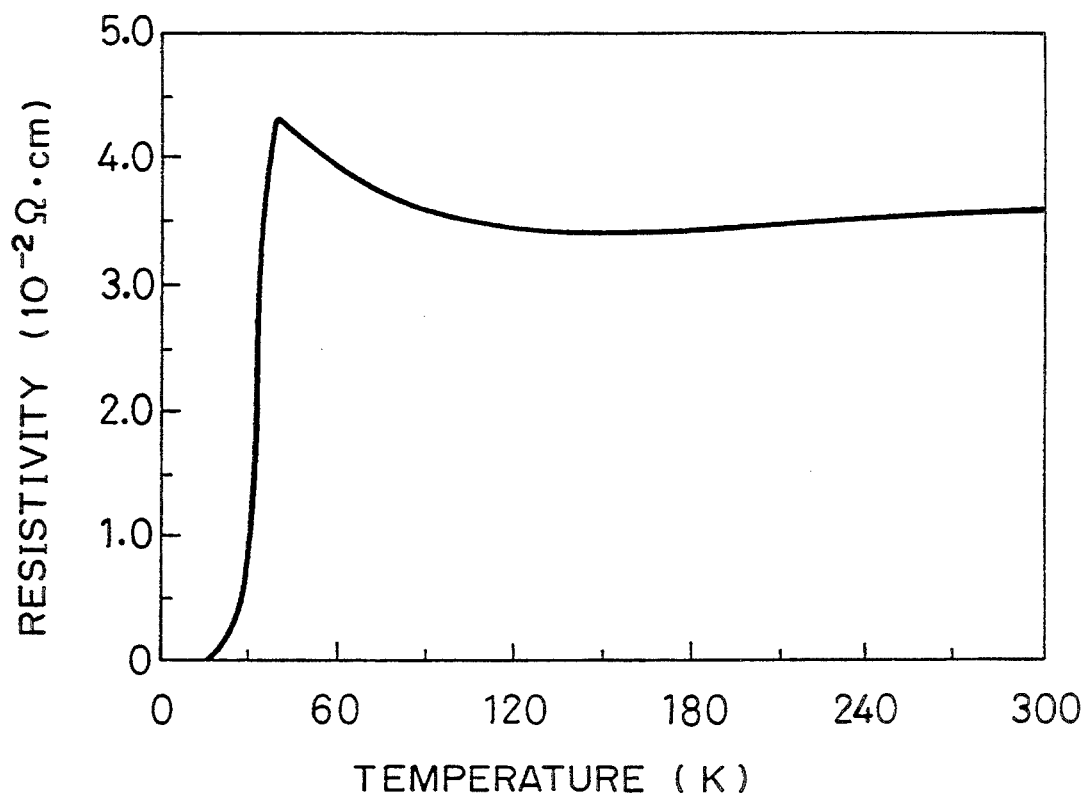
FIG. 16 is a diagram showing the temperature dependence of electrical resistivity for a sintered sample obtained by example 20.

Then, the calcined pellet was sintered at 1,050° C. for 20 hours in a mixed gas of 90% Ar and 10% $O_2$ at a total pressure of 2,000 atm (partial pressure of oxygen being 200 atm). The resultant sintered material substantially had a single phase of $BaSrCu_{1.1}O_{2.2+d}(CO_3)_{0.9}$. FIG. 16 is a graph which illustrates dependence of the resistivity of the sintered material on temperature. As will be understood from FIG. 16, the resistivity decreased at about 40 K, which indicates that the sintered material is a superconductor. Here, it is noted that the decreasing rate in the resistivity becomes smaller below 28K to form a trailing slope. This would be ascribable to the presence of a small amount of $Sr_2CuO_3$ as impurity.

EXAMPLE 21

Starting materials of $BaC_2O_4$, $SrCO_3$ and $Cu(NO_3)_2 \cdot 3H_2O$ were weighed and mixed with each other to prepare a mixture with a molar ratio of $BaC_2O_4:SrCO_3:Cu(NO_3)_2 \cdot 3H_2O=2:1:2$ (molar ratio of alkaline earth metals: Cu being 1.5:1). The powder mixture was calcined as it was at 870° C. for 20 hours.

Figure 17:
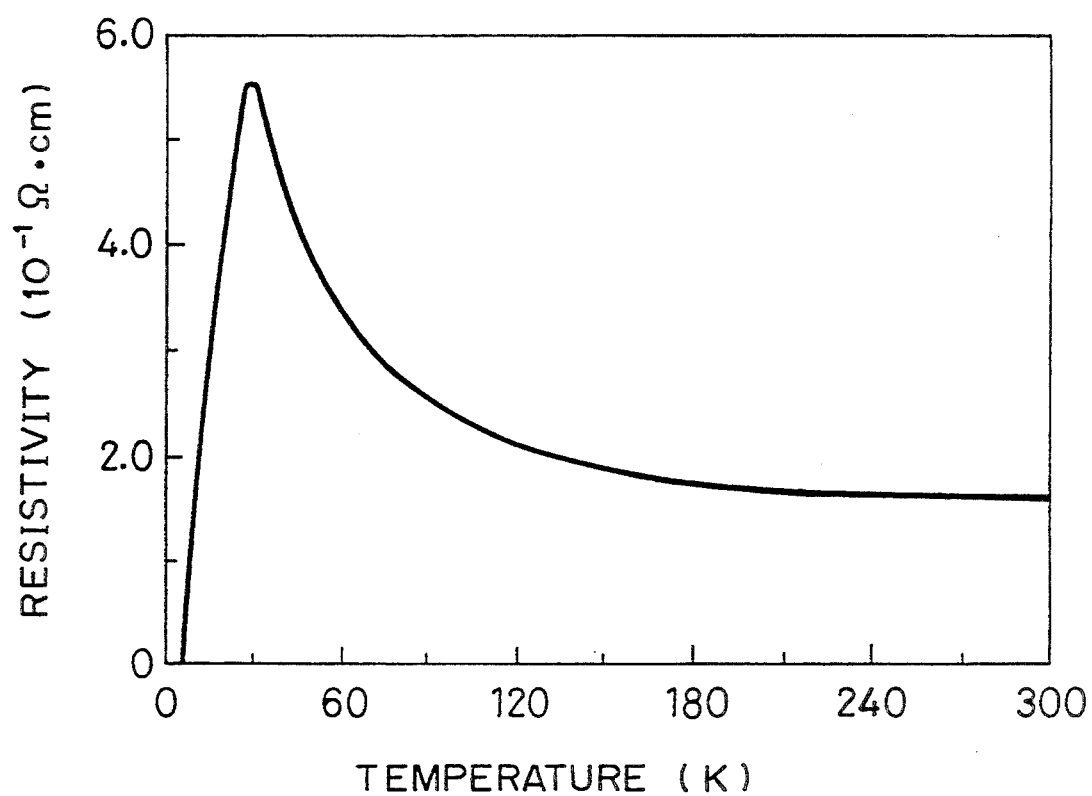
FIG. 17 is a diagram showing the temperature dependence of electrical resistivity for a sintered sample obtained by example 21.

The resultant calcined pellet was pulverized, pressed into a pellet at about 1 t/cm$^2$ and sintered at a temperature of 980° C. for 100 hours in a mixed gas of 80% Ar and 20% $O_2$ at a total pressure of 100 atm (partial pressure of oxygen being 20 atm). FIG. 17 is a graph which illustrates the dependence of the resistivity of the sintered material on temperature. As will be understood from FIG. 17, the resistivity begins to decrease at about 28 K and is completely zero at 5 K.

As the starting materials, barium oxalate, strontium oxalate, copper carbonate, copper nitrate, copper oxalate and metallic copper can be used.

C. A Coherence Length of Novel Copper Oxide Superconductor Containing Carbonate Radicals

EXAMPLE 22

The superconductors of examples 1 to 18 according to the present invention and examples 19 to 21 prepared by the method according to the present invention are superconductors of the type II and have an upper critical magnetic field Accordingly, a coherence length can be calculated from the following equation.

$H_{c2} = \Phi_0 2\pi\xi^2$ (wherein $\Phi_0$ is a fluxoid quantum and is a coherence length)

First, the value of the upper critical magnetic field $H_{c2}$ was measured. In this case, the basic data is a dependence of resistivity on temperature in the magnetic field.

Figure 18:
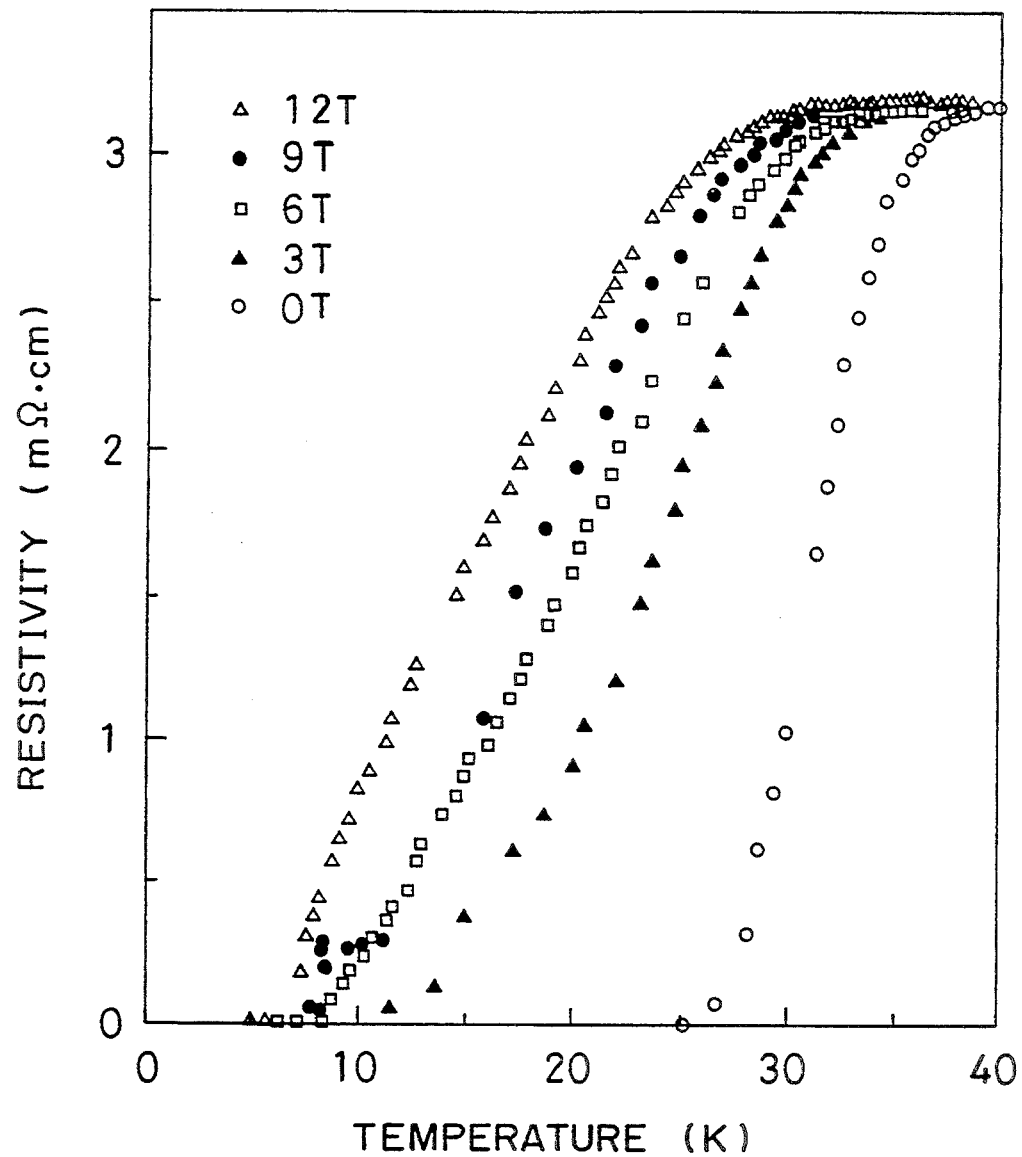
FIG. 18 is a diagram showing the variation of temperature dependence of the resistivity with the magnetic field.

A mixed powder of $BaCO_3$, $SrCO_3$ and CuO were pressed into a pellet and sintered at 1,000° C. for 50 hours under 50 atm of the partial pressure of oxygen and thus a sample having a composition of $(Ba_{0.55}Sr_{0.45})_2Cu_{1.1}O_{2.2+\delta}(CO_3)_{0.9}$ was prepared. The variation of the dependence of the resistivity of this sample on the temperature with the magnetic field was measured. Obtained results are shown in FIG. 18.. In FIG. 18, the symbol T denotes a unit of the magnetic field, Tesla.

Figure 19:
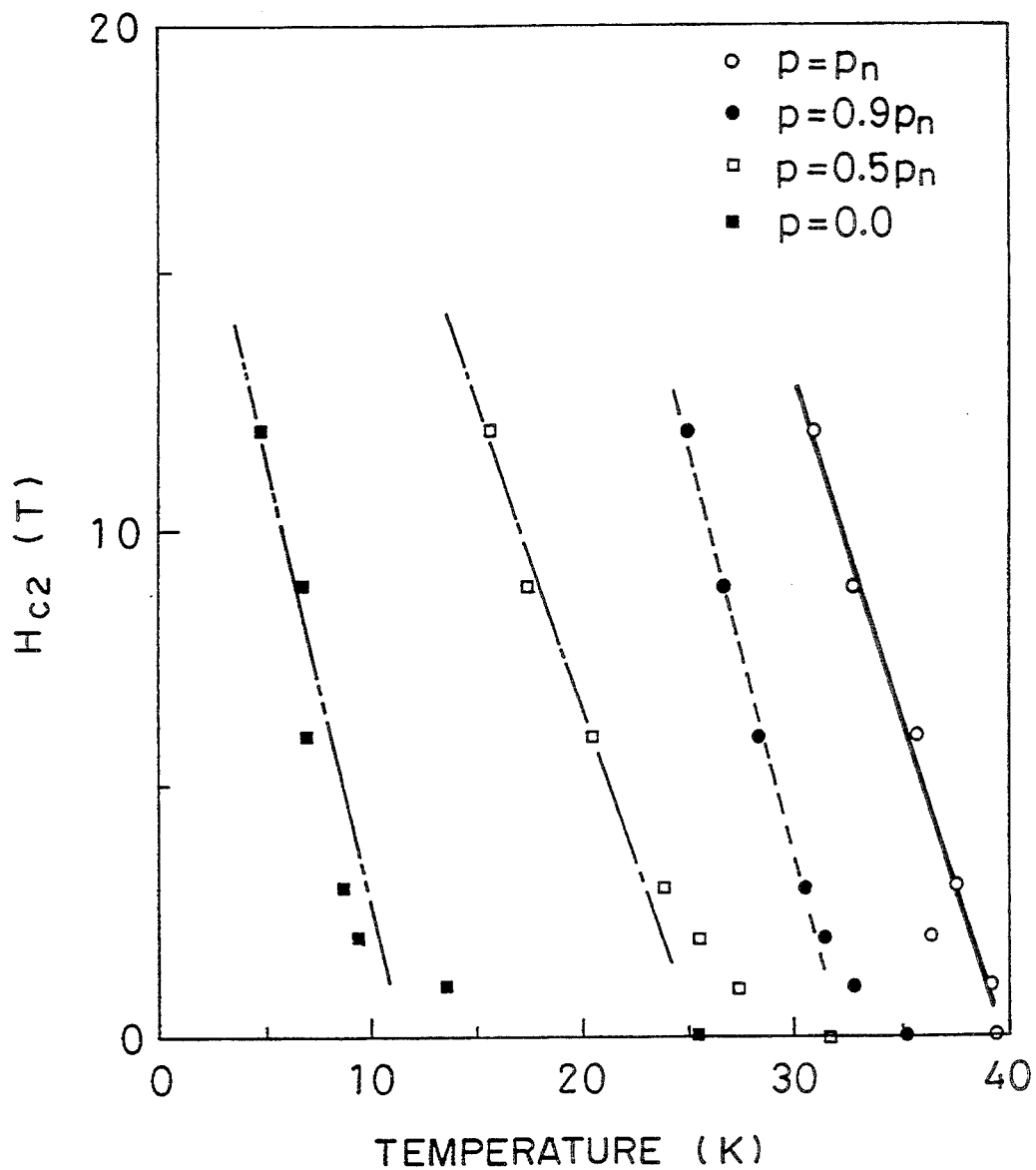
FIG. 19 is a diagram showing the temperature dependence of $H_{c2}$.

From FIG. 18, $H_{c2}$ at which the superconductivity disappears can be determined. In the case of this superconductor, the resistivity ($\rho$) decreases from the normal conducting state to the superconducting state with drawing a curve of gentle slope. Hence, in this case, the estimation of $H_{c2}$ includes an uncertainty to some extent. That is, $H_{c2}$ is dependent on the estimation of the boundary between the normal conducting and the superconducting states, i.e., $H_{c2}$ depends on whether the boundary is regarded (a) as the value from which the resistivity begins to decrease or (b) as a middle value ($\rho=0.5\ \rho n$) of the normal conductivity, or (c) as a complete zero resistance ($\rho=0$) value (refer to FIG. 19). However, since in every cases, the difference in the variation of $H_{c2}$ with temperature is very small, and the upper critical magnetic field $H_{c2}$ (0) at 0 K can be determined as $H_{c2}(0) = 39$ T with a small error from the equation $H_{c2}(0) = -0.69\ T_c(dH_{c2}/dT)_{T=Tc}$, accordingly the value of the coherence length $\xi$ is determined as about 30 (Å).

As explained above, according to the present invention, a novel superconductor having a $T_c$ value of about 30 K and a coherence length of about 30 Å can be obtained. It should be noted that the superconductor according to the present invention has a longer coherence length as compared with the conventional high-Tc superconductor, and because of this, various devices utilizing the superconductor according to the present invention can be realized. For example, a junction composed of two superconductors and a thin insulation film interposed between the superconductors, that is, superconductor-insulator-superconductor (SIS) junction, can easily be prepared, and as a result, such junction can be applied in various electronics field.

D. A Josephson Junction Using a Novel Copper Oxide Superconductor Containing Carbonate Radicals

EXAMPLE 23

A Josephson junction was fabricated with the aforementioned superconductor of the present invention.

More specifically, a target made of a sintered material having a composition of $(Ba_{0.55}Sr_{0.45})_2Cu_{1.1}O_{2.2+d}(CO_3)_{0.9}$ was fabricated by the same method as described in the aforementioned fabrication method for a superconductor. Using this target, a superconductor thin film 32 was deposited on a (100) MgO substrate 31 by an rf magnetron sputtering method.

Representative sputtering conditions are as follows:

| | |
|---|---|
| Total gas pressure: | 20 to 70 mTorr |
| Oxygen partial pressure: | 1 to 14 mTorr |
| Substrate temperature: | 360 to 500° C. |
| Sputtering power: | 120 W |
| Deposition rate: | 10 to 20 Å/minute |
| Film thickness: | 1,000 to 2,000 Å |

Figure 20A:
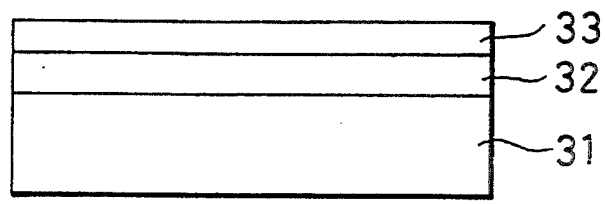
FIGS. 20A, 20B, 20C and 20D are sectional views illustrating processes for the fabrication of an SIS junction.

Next, the target was switched to a $BaCO_3$ target and a $BaCO_3$ film 33 was deposited to a thickness of about 20 Å under the same sputtering conditions as above to form a junction between the superconductor and an insulator (FIG. 20A).

Then, the resultant two-layer laminate film was processed all over by a photolisographic process and an Ar ion milling process so as to have a width of about 100 μm.

Figure 20B:
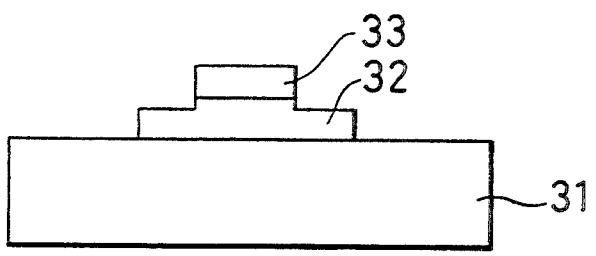
Figure 20C:
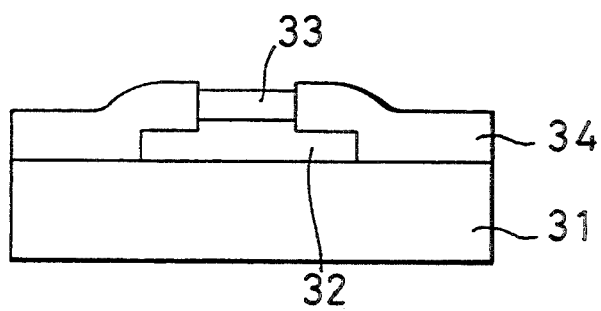

Further, the $BaCO_3$ insulator film 33 was processed by a photolisographic process and an Ar ion milling process to a width of 20 to 50 μm (FIG. 20B). Then, an SiO film 34 was deposited around the junction for passivation (FIG. 20C).

Figure 20D:
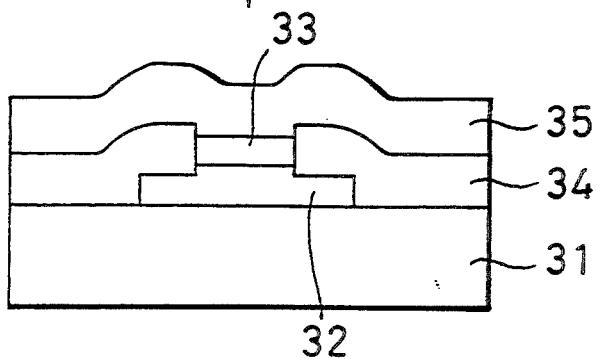
Figure 21:
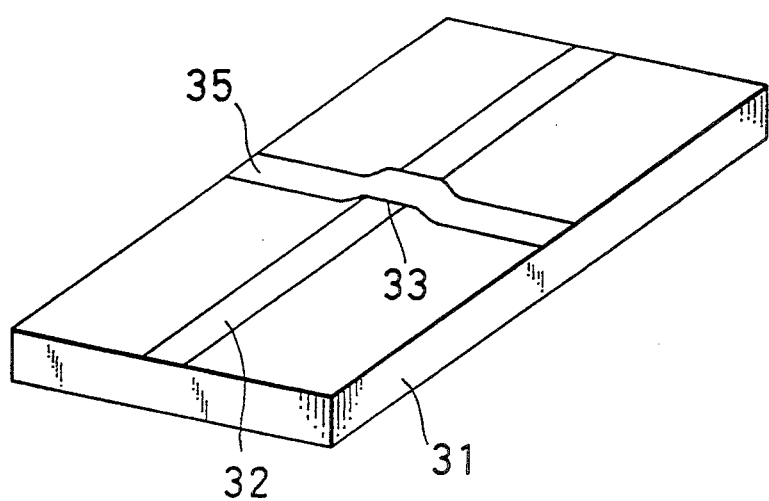
FIG. 21 is a perspective view illustrating a SIS-type Josephson junction obtained by the fabrication processes shown in FIGS. 20A–20D.

On the $BaCO_3$ film 33 was deposited a film 35 of a superconductor of the present invention (FIG. 20D), and the film 35 was processed to a width of about 100 μm by a photolisographic process and an Ar ion milling process to fabricate a Superconductor-Insulator-Superconductor (SIS) junction as shown in FIG. 21, in which the passivation film 34 is not shown.

Upon determination of I-V characteristics of the SIS junction, super current at zero voltage was observed. This confirms that the SIS junction obtained is a Josephson junction.

$SrCO_3$, $SrCuO_2$ or $Sr_2CuO_3$ can be used as an insulator in lieu of $BaCO_3$ and furthermore a film of insulating Ba-Sr-Cu-C-O system compounds having a composition represented by a composition formula $(Ba_{1-x}Sr_x)_2CuO_2CO_3$ (wherein $0 \leq x \leq 1$) can be used.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A process for preparing a copper oxide superconductor containing carbonate radical, comprising the steps of:

weighting and mixing alkaline earth metal compounds, and a copper compound or metallic copper so that the molar ratio of said alkaline earth metal to said metallic copper is in the range from 1.1 to 2.25 to thereby obtain a mixture, said alkaline earth metal compounds including a barium compound selected from the group consisting of barium carbonate and a barium oxalate, and a strontium compound selected from the group consisting of strontium carbonate and strontium oxalate, and said copper compound selected from the group consisting of copper carbonate, copper nitrate, copper oxalate and copper oxide;

pressing said mixture to form a pellet; and sintering said pellet in an oxygen atmosphere.

2. A process for preparing a copper oxide superconductor containing carbonate radicals as claimed in claim 1, wherein said sintering step is performed at a temperature within a range from 900° C. to 1,050° C. in an atmosphere having an oxygen partial pressure between 5 and 400 atm for a period from 10 to 100 hours.

3. A process for preparing a copper oxide superconductor containing carbonate radicals as claimed in claim 2, wherein said oxygen partial pressure is in the range from 10 to 400 atm and said sintering step is performed in a mixed gas of oxygen and an inert gas by using a hot isostatic pressing apparatus.

4. A process for preparing a copper oxide superconductor containing carbonate radicals as claimed in claim 3, wherein said mixed gas comprises argon gas and oxygen gas at a mixed ratio of 80:20 by volume.

5. A process for preparing a copper oxide superconductor containing carbonate radicals as claimed in claim 1, further comprising a calcining step calcining said pellet before said sintering step, wherein said sintering step is performed at a temperature which is higher than said calcining step.

6. A process for preparing a copper oxide superconductor containing carbonate radicals as claimed in claim 5, wherein said calcining step is performed at a temperature within a range from 800 to 870° C. for a period from 1 to 200 hours.

* * * * *